United States Patent
Pebay-Peyroula et al.

(10) Patent No.: US 9,001,931 B2
(45) Date of Patent: Apr. 7, 2015

(54) METHOD AND DEVICE FOR DIGITAL MODULATION WITH LOW TRANSITION DENSITY

(71) Applicant: Commissariat a l'energie Atomique et aux Ene Alt, Paris (FR)

(72) Inventors: Florian Pebay-Peyroula, Saint-Nizier-du-Moucherotta (FR); Jean-Baptiste Dore, Saint Martin le Vinoux (FR)

(73) Assignee: Commissariat a l'énergies Atomique et aux énergies alternatives, Paris (FR)

( * ) Notice: Subject to any disclaimer, the term of this patent is extended or adjusted under 35 U.S.C. 154(b) by 0 days.

(21) Appl. No.: 14/067,222

(22) Filed: Oct. 30, 2013

(65) Prior Publication Data

US 2014/0125423 A1    May 8, 2014

(30) Foreign Application Priority Data

Nov. 2, 2012 (FR) .................................. 12 60460

(51) Int. Cl.
*H04L 27/20* (2006.01)
*H03C 3/02* (2006.01)
*H04L 1/00* (2006.01)
*G06K 19/07* (2006.01)

(52) U.S. Cl.
CPC ............. *H03C 3/02* (2013.01); *H04L 1/0042* (2013.01); *H04L 27/2046* (2013.01); *G06K 19/0723* (2013.01)

(58) Field of Classification Search
CPC .... H03C 3/02; H04L 27/2046; H04L 1/0042; H04L 27/2092; H04L 27/2071; H04L 27/0008; H04L 27/18; G06K 19/0723; H03B 28/00

USPC .......................................... 375/308; 332/103
See application file for complete search history.

(56) References Cited

U.S. PATENT DOCUMENTS

| 7,564,892 B1* | 7/2009 | Lidstrom et al. ............... 375/211 |
| 2005/0185734 A1* | 8/2005 | Hottinen et al. ............... 375/295 |

OTHER PUBLICATIONS

U.S. Appl. No. 14/318,838, filed Jun. 30, 2014, Dore, et al.
French Preliminary Search Report issued Aug. 22, 2013, in French Application No. 12 60460 filed Nov. 2, 2012 (with English Translation of Categories of Cited Documents).
Manfred Litzenburger, et al., "A Comparison of Trellis Shaping Schemes for Controlling the Envelope of a Bandlimited PSK-Signal", Vehicular Technology Conference, IEEE 44$^{th}$ Stockholm, Sweden, Jun. 8-10, 1994, 5 pages.

* cited by examiner

*Primary Examiner* — Juan A Torres
(74) *Attorney, Agent, or Firm* — Oblon, McClelland, Maier & Neustadt, L.L.P.

(57) ABSTRACT

The present invention relates to a digital modulation method and a corresponding modulator. The modulator comprises a transcoder (110) followed by a FIFO register (120) and a 2-PSK modulator (130). The transcoder codes a binary word of fixed size into a code word of variable size using a transcoding table. The transcoding table codes at least one first binary word, leading to a first number of phase transitions at the output of the modulator, into a second word of size greater than that of the first word, leading to, at the output of the modulator, a second number of phase transitions less than the first number of phase transitions.

12 Claims, 4 Drawing Sheets

| $w_{k-1}$ | $w_k$ | $w'_k$ |
|---|---|---|
| 0 | 0 | 0 |
| 1 | 0 | 11 |
| 0 | 1 | 00 |
| 1 | 1 | 1 |

Fig. 2A

| $w_{k-1}$ | $w_k$ | $w'_k$ |
|---|---|---|
| 0 | 0 | 0 |
| 1 | 0 | 0 |
| 0 | 1 | 11 |
| 1 | 1 | 1 |

Fig. 2B

| $w_{k-1}$ | $w_k$ | $w'_k$ |
|---|---|---|
| 0 | 0 | 0 |
| 1 | 0 | 00 |
| 0 | 1 | 1 |
| 1 | 1 | 1 |

Fig. 2C

| $w_{k-1}$ | $w_k$ | $w'_k$ |
|---|---|---|
| 00 | 00 | 00 |
| 00 | 01 | 01 |
| 00 | 10 | 001 |
| 00 | 11 | 11 |
| 01 | 00 | 111 |
| 01 | 01 | 000 |
| 01 | 10 | 10 |
| 01 | 11 | 11 |
| 10 | 00 | 00 |
| 10 | 01 | 000 |
| 10 | 10 | 111 |
| 10 | 11 | 11 |
| 11 | 00 | 00 |
| 11 | 01 | 110 |
| 11 | 10 | 10 |
| 11 | 11 | 11 |

Fig. 3A

| $w_{k-1}$ | $w_k$ | $w'_k$ |
|---|---|---|
| 00 | 00 | 00 |
| 00 | 01 | 01 |
| 00 | 10 | 10 |
| 00 | 11 | 11 |
| 01 | 00 | 00 |
| 01 | 01 | 111 |
| 01 | 10 | 10 |
| 01 | 11 | 11 |
| 10 | 00 | 00 |
| 10 | 01 | 01 |
| 10 | 10 | 000 |
| 10 | 11 | 11 |
| 11 | 00 | 00 |
| 11 | 01 | 01 |
| 11 | 10 | 10 |
| 11 | 11 | 11 |

Fig. 3B

| $w_{k-1}$ | $w_k$ | $w'_k$ |
|---|---|---|
| 0 | 0 | 0 |
| 1 | 0 | 00 |
| 0 | 1 | 11 |
| 1 | 1 | 1 |

METHOD AND DEVICE FOR DIGITAL MODULATION WITH LOW TRANSITION DENSITY

TECHNICAL FIELD

The present invention generally speaking relates to the field of digital modulation. It applies more particularly to near field communication systems, such as RFID (Radio Frequency Identification) or NFC (Near Field Communication) systems.

PRIOR ART

Near field communication systems (RFID, NFC) are very widespread in the general public.

Initially intended to transfer small amounts of data, these systems henceforth require for certain new applications (transfer of biometric files stored in electronic passports, transfer of image files stored in medical dossiers, etc.) to be able to transmit an important quantity of information in very short times.

Also, within the scope of the ISO 14443 standard relative to contactless identification cards, an evolution of the characteristics of the physical layer making it possible to withstand very high rates (up to 27.12 Mbits/s) has been proposed. More generally, the ISO 14443 standard defines the characteristics with which a two-directional communication between a contactless reader, also known as PCD (Proximity Coupling Device) and a passive transponder or PICC (Passive Inductive Coupled Card) must comply.

On the uplink, the passive transponder transmits the information items by modulating the phase of a carrier at the frequency $F_{sc}$, the phase modulation being performed by simply connecting and disconnecting the antenna to a load. The bits to be transmitted are subject to a BPSK (Binary Phase Shift Keying) modulation, the BPSK symbols modulating the carrier at a modulation frequency $F_s = F_{sc}/n$ where n is a whole number.

Conversely, on the downlink, it is provided in the standard in question that the contactless reader can transmit at high rate (6.8 Mbits/s to 27.12 Mbits/s) by means of a M-PSK modulation. More precisely, the bits are converted into symbols of a M-PSK modulation alphabet, each symbol being transmitted during a symbol time $T_s = 1/F_s$. The degree of modulation, in other words the cardinal of the modulation alphabet, as well as the symbol time give the bit rate.

At present, the degree of modulation M is set at 2, a bit equal to 0 being transmitted with a phase $-\Phi/2$ and a bit equal to 1 with a phase $\Phi/2$ where $\Phi$ is an angle less $\pi/2$. The value of $\Phi$ is chosen preferably relatively low to minimise the discontinuities of the signal, for example $\Phi=\pi/8$.

The signal transmitted by the reader may be expressed in the form:

$$s(t) = A \cos(2\pi F_c t + m(t) + \phi_0) \quad (1)$$

where A, $F_c$ and $\phi_0$ are respectively the amplitude, the frequency and the phase behind the carrier and where m(t) is the phase modulation term given by:

$$m(t) = \sum_k \Phi_k g(t - kT_s) \quad (2)$$

where $\Phi_k$ is the phase of the $k^{th}$ PSK symbol and g(t) is a shaping function for example the boxcar function defined by:

$$g(t)=1 \text{ if } 0 \leq t < T_s$$
$$g(t)=0 \text{ if not} \quad (3)$$

At the level of the PICC, the signal received is translated into base band, sampled with a frequency $F_s$ the samples obtained, $r_k$, may be expressed in the form:

$$r_k = a_k e^{j\Phi_k} \quad (4)$$

where $\alpha_k$ is the amplitude (positive real) of the sample and $\Phi_k$ its phase. A perfect synchronisation of the sampling with respect to the symbols received is assumed in the following.

The samples thereby obtained are then subject to a differential phase modulation. In an equivalent manner, the differential phase modulation may be performed in analogic and the sampled result is converted into digital. In all cases, the differential demodulator supplies the phase difference between two consecutive samples of the signal in base band:

$$y_k = \arg(r_k r^*_{k-1}) \quad (5)$$

where arg(z) represents the phase of the complex number z and .* is the phase conjugation.

In the absence of inter-symbol interference and noise on the transmission channel, the phase $y_k$ at the output of the differential demodulator is none other than:

$$y_k = \Phi_k - \Phi_{k-1} \quad (6)$$

Thus, if the depart phase is known, the $\Phi_k$ phases and thus the bits transmitted may be deduced therefrom.

When the information bits are constituted of an alternating sequence of 0 and 1, the modulation symbols form a series of complex values alternating between $e^{j\Phi/2}$ and $e^{-j\Phi/2}$ in other words the sinusoid modulated by the modulation symbols has a phase jump of $\Phi$ at each symbol period $T_s$.

It follows that the modulated signal may be of relatively wide spectrum and, consequently, subject to attenuation of its high frequencies, given the limited pass band of the transmission channel (including the differential demodulator). The attenuation of the high frequencies of the signal leads to an increase in the binary error rate (BER) at the receiver.

The aim of the present invention is to propose a coding and modulation method, for example for the transmitter of a PCD reader, which makes it possible to obtain a narrower modulated signal spectrum than in the prior art, for a same binary transmission rate.

DESCRIPTION OF THE INVENTION

The present invention is defined as a digital modulation method transforming a sequence of input words ($w_k$), each constituted of m information symbols, into a sequence of M-PSK modulation symbols where $M=2^m$, said method comprising:

a step of transcoding, wherein each input word ($w_k$) is coded into a code word ($w'_k$) of variable length using a transcoding table, the transcoding table coding at least one first input word, leading to a first number of phase transitions in said sequence of modulation symbols, into a second word of size greater than m, leading to a second number of phase transitions less than said first number in said sequence;

a step of concatenation of the code words ($w'_k$) obtained at the preceding step to supply a sequence of output words ($w''_k$), each output word being constituted of m information symbols;

a M-PSK modulation supplying for each output word of the sequence a corresponding M-PSK symbol.

According to a first variant, the transcoding table supplies a code word $w'_k$ for each input word $w_k$, the code word $w'_k$ depending on the input word in question as well as on the state of the transcoder, the state of the transcoder being determined by the K last input words of the transcoder and the K' last code words supplied by the transcoder, where K and K' are integers greater than or equal to 1.

According to a second variant, the transcoding table supplies a code word $w'_k$ for each input word $w_k$, the code word $w'_k$ depending on the input word in question as well as on the state of the transcoder, the state of the transcoder being determined by the K last input words of the transcoder, where K is an integer greater than or equal to 1.

Typically, the information symbols are each constituted of a bit and the input words as well as the output words are then binary, and M=2.

Advantageously, an input binary word $w_k$ leading to in the sequence of modulation symbols $\mu_k=(K+1)m-1$ phase transitions is coded into a word $w'_k$ of size m+1, in which all of the bits have the same value.

According to a first embodiment example, K=1, m=1, and the transcoding table is given by:

| $w_{k-1}$ | $w_k$ | $w'_k$ |
|---|---|---|
| 0 | 0 | 0 |
| 1 | 0 | 11 |
| 0 | 1 | 00 |
| 1 | 1 | 1 |

According to a second embodiment example, K=1, m=1, and the transcoding table is given by:

| $w_{k-1}$ | $w_k$ | $w'_k$ |
|---|---|---|
| 0 | 0 | 0 |
| 1 | 0 | 0 |
| 0 | 1 | 11 |
| 1 | 1 | 1 |

According to a third embodiment example, K=1, m=1, and the transcoding table is given by:

| $w_{k-1}$ | $w_k$ | $w'_k$ |
|---|---|---|
| 0 | 0 | 0 |
| 1 | 0 | 00 |
| 0 | 1 | 1 |
| 1 | 1 | 1 |

The 2-PSK modulation step transforms for example a bit of a first value into $$e^{-j\frac{\Phi}{2}}$$

and a bit of a second value, opposite to the first value, into $$e^{+j\frac{\Phi}{2}}$$

where $\Phi$ is an angle less than $\pi/2$.

The invention also relates to a digital modulator transforming a sequence of input words ($w_k$), each constituted of information symbols, into a sequence of M-PSK modulation symbols where $M=2^m$, said modulator comprising:

a transcoder wherein each input word is coded into a code word of variable length using a transcoding table stored within the transcoder, the transcoding table coding at least one first word, leading to a first number of phase transitions in said sequence of modulation symbols, into a second word of size greater than m leading to a second number of phase transitions less than said first number in said sequence;

a FIFO register adapted to concatenate code words obtained at the preceding step to supply a sequence of output words ($w''_k$), each output word being constituted of m information symbols;

a M-PSK modulator supplying for each output word a corresponding M-PSK symbol.

According to a first variant, the transcoding table supplies a code word $w'_k$ for each input word $w_k$, the code word $w'_k$ depending on the binary word in question as well as on the state of the transcoder, the state of the transcoder being determined by the K last input words of the transcoder and the K' last code words supplied by the transcoder, where K and K' are whole numbers greater than or equal to 1.

According to a second variant, the transcoding table supplies a code word $w'_k$ for each input word $w_k$, the code word $w'_k$ depending on the binary word in question as well as on the state of the transcoder, the state of the transcoder being determined by the K last binary words at the input of the transcoder, where K is a whole number greater than or equal to 1.

BRIEF DESCRIPTION OF DRAWINGS

FIG. 2A represents a first example of transcoding table for the digital modulation device of FIG. 1 when the input words are of 1 bit;

FIG. 2B represents a second example of transcoding table for the digital modulation device of FIG. 1 when the input words are of 1 bit;

FIG. 2C represents a third example of transcoding table for the digital modulation device of FIG. 1 when the input words are of 1 bit;

FIG. 3A represents a fourth example of transcoding table for the digital modulation device of FIG. 1 when the input words are of 2 bits;

FIG. 3B represents a fifth example of transcoding table for the digital modulation device of FIG. 1 when the input words are of 2 bits.

DETAILED DESCRIPTION OF PARTICULAR EMBODIMENTS

We will consider hereafter a transmitter, for example the transmitter of a PCD reader, adapted to transmit information in the form of words of m information symbols.

The transmission may occur by packets, each packet comprising a header followed by a payload, the payload being constituted of a sequence of m information symbols.

Each information symbol is mapped on a M-PSK modulation symbol where $M=2^m$.

In the particular case where the information symbols are bits, each bit value is mapped on a 2-PSK modulation symbol, for example the bit 0 is mapped on the symbol $$e^{-j\frac{\Phi}{2}}$$

and the bit 1 on the symbol $$e^{+j\frac{\Phi}{2}}.$$

The modulation symbols thereby obtained are used to modulate a carrier at the frequency $F_{sc}$. The transmitter transmits on the transmission channel, the signal obtained by modulation of the carrier, potentially after translation into frequency.

The transformation of the words of m information symbols into M-PSK modulation symbols is performed by a digital modulator according to the invention.

To simplify presentation, but without prejudicing generalisation, we will envisage more particularly hereafter the case where said information symbols are bits. Nevertheless, generally speaking, those skilled in the art will understand that these information symbols may be constituted of one or more bits.

Figure 1:
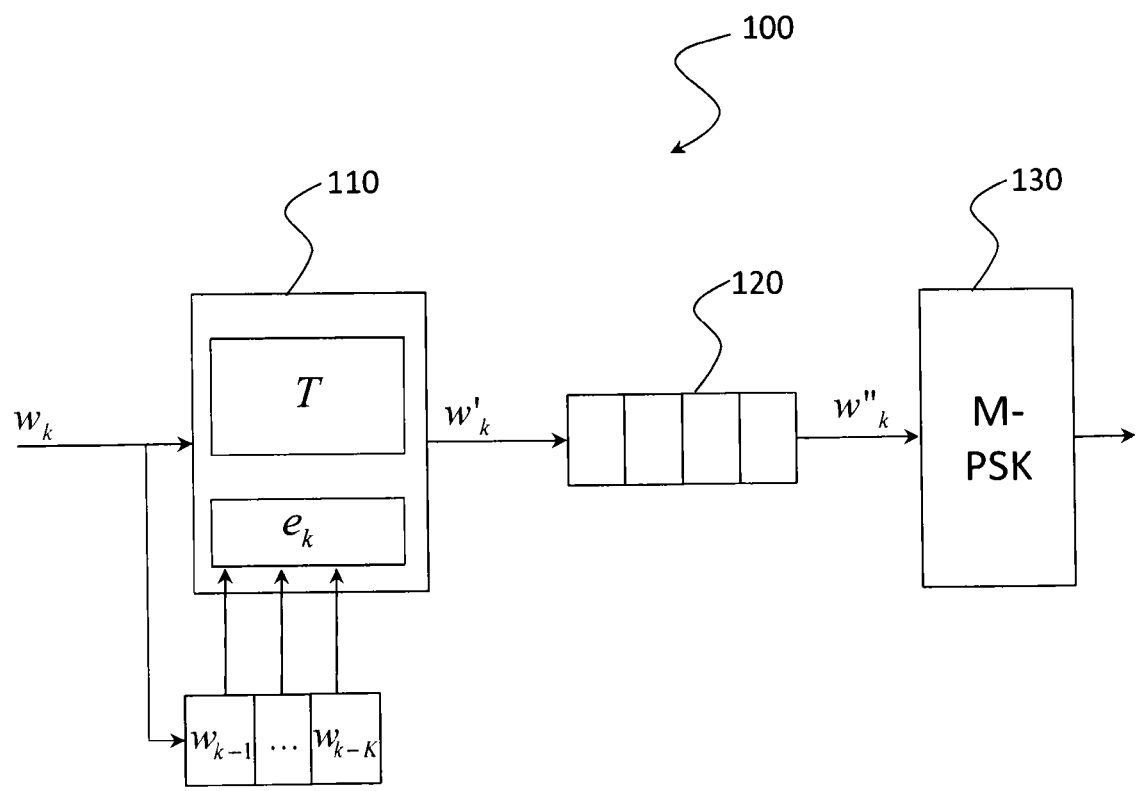
FIG. 1 represents in a schematic manner a digital modulation device according to a first embodiment of the invention.

FIG. 1 represents a digital modulation device according to a first embodiment of the invention.

This digital modulation system, 100, comprises a transcoder, 110, transforming the words of m information symbols into words of variable length according to a transcoding table T described hereafter.

The transcoder functions like a finite state machine, the word supplies at the output at each coding period k depending on the state of the transcoder and the word present at its input. More precisely, the transcoder transforms a word at the input $w_k$ constituted of m information symbols into a word $w'_k$ of variable length, such that:

$$w'_k = F(w_k | e_k) \tag{7}$$

where $e_k$ designates the state of the transcoder at the instant k and $F(w_k | e_k)$ is the response of the transcoder to the word $w_k$ when it is in the state $e_k$. The function F is defined by a transcoding table T stored in the transcoder.

Generally speaking, the state $e_k$ may depend on the K preceding words $w_{k-1}, \ldots, w_{k-K}$.

The words of variable length, $w'_k$, are stored one after the other in a FIFO register First In First Out), 120. In other words, the words are concatenated so as to form a sequence of information symbols in the register 120.

Generally speaking, the FIFO register supplies a word of m information symbols, each information symbol then being transformed into a M-PSK symbol by the modulator 130. It will be understood that the FIFO register makes it possible to pass from a sequence of words of variable length to a sequence of words of fixed length equal to m.

In the case where the information symbols are bits, the FIFO register supplies a word of m bits, $w''_k$, at each modulation period, each of the bits of $w''_k$ then being transformed into a 2-PSK symbol by the binary modulator at symbol 130. In this case, any binary transition from a bit 1 to a bit 0 or conversely from a bit 0 to a bit 1 results in a phase jump at the output. When these phase jumps are frequent, the spectrum of the modulated signal is relatively wide.

The basic idea of the present invention is to reduce the density of phase transitions at the output of the binary modulator at symbol 130 thanks to a coding of variable length. More precisely, the transcoder transforms the word $w_k$ into a word $w'_k$, such that the sequence of K+1 words:

$$v'_k = w'_k w_{k-1} \ldots w_{k-K} \tag{8}$$

gives at the output of the modulator a number of phase transitions lower than that of the original sequence:

$$v_k = w_k w_{k-1} \ldots w_{k-K} \tag{9}$$

FIG. 2A gives a first example of transcoding table when K=1 and m=1, in other words when the words are reduced to a single bit and the state of the transcoder only depends on the preceding bit.

In this example, it may be seen that the bits 0 and 1 are left invariant if the preceding bit is of same value as the current bit (2 first lines of the table) whereas a binary transition 0→1 (resp. 1→0) results in a code word of length 2, i.e. 00 if the preceding bit was 0 and 11 if the preceding bit was 1 (cf. the $2^{nd}$ and $3^{rd}$ lines of the table). The number of transitions within the sequence $v'_k$ is thus here zero in all cases.

Thus, for example, the sequence of bits 0101 at the input of the transcoder results for its part at the output in a sequence 0001100. The output of the modulator 130 is given by the sequence of symbols $$e^{-j\frac{\Phi}{2}}, e^{-j\frac{\Phi}{2}}, e^{-j\frac{\Phi}{2}}, e^{+j\frac{\Phi}{2}}, e^{+j\frac{\Phi}{2}}, e^{-j\frac{\Phi}{2}}, e^{-j\frac{\Phi}{2}}$$

at the frequency $1/T_s$, whereas in the absence of transcoding, this sequence would have been $$e^{-j\frac{\Phi}{2}}, e^{+j\frac{\Phi}{2}}, e^{-j\frac{\Phi}{2}}, e^{+j\frac{\Phi}{2}}$$

at the same frequency. It will be understood that the density of phase transitions per time unit is lower and that consequently the spectrum of the modulated signal has a reduced bandwidth.

A second example of transcoding table is given by FIG. 2B, for K=1 and m=1.

In this example, only the transition 0→1 results in a code word of length 2, here 11 but 00 would also have been suitable (line 3 of the table).

The transcoding leaves the bit $w_k$ invariant for the other sequences $v_k$.

A third example of transcoding table is given by FIG. 2C, for K=1 and m=1.

In this example, only the transition 1→0 is replaced by a word of length 2 without internal transition (here 00 but 11 would also have been suitable) (line 3 of the table).

The transcoding leaves the bit $w_k$ invariant for the other sequences $v_k$.

It will be understood that the transcoding tables given in the second and third examples make it possible to obtain a higher modulation speed than in the first example, at the price nevertheless of a wider modulated signal spectrum.

FIG. 3A gives a fourth example of transcoding table when K=1 and m=2.

In the left hand column is represented the preceding word, $w_{k-1}$, determining the state $e_k$ of the transcoder and in the right hand column, the current word to code, $w_k$, each line corresponding to a different sequence $v_k$.

It may be noted that two of these sequences comprise 3 transitions (lines 5 and 11). The words $w_k$ corresponding to these sequences are coded into code words of variable length, $w'_k$, namely 111 and 000.

It may also be noted that six of these sequences comprise 2 transitions (lines 3, 5, 7, 10, 12, 14). For some of these sequences, the words $w_k$ are coded into words of variable length (lines 3, 5, 10, 14), the others remaining invariant by the transcoding.

FIG. 3B gives a fifth example of transcoding table when K=1 and m=2.

This fifth example differs from the preceding in that only the words $w_k$ leading to sequences $v_k$ having the maximum number of transitions (3) are coded by words $w'_k$ of length 3, the other words remaining unchanged in the transcoding.

It is understood that the fifth example makes it possible to obtain a higher modulation speed than in the fourth example, at the price nevertheless of a wider modulated signal spectrum.

More generally, a transcoder in which the input words are of size m and in which the state $e_k$ at the instant depends on the preceding K words $w_{k-1}, \ldots, w_{k-K}$, will comprise a transcoding table T wherein at least one word $w_k$ leading to a sequence $v_k = w_k w_{k-1} \ldots w_{k-K}$ having a number $\mu_k$ of binary transitions is coded into a word $w'_k$ such that the sequence $v'_k = w'_k w_{k-1} \ldots w_{k-K}$ has a number of binary transitions $\mu'_k < \mu_k$, each binary transition corresponding to a phase transition in the sequence of 2-PSK modulation symbols.

Preferably, the transcoding table codes a word $w_k$ leading to a sequence $v_k = w_k w_{k-1} \ldots w_{k-K}$ having a maximum number $\mu_k = (K+1)m-1$ of transitions is coded into a word $w'_k$ of size m+1, in which all the bits have the same value.

If needs be, other words $w_k$ giving rise to a sequence $v_k = w_k w_{k-1} \ldots w_{k-K}$ having a number of transitions equal to $(K+1)m-2$ are coded by words $w'_k$ of size m+1 such that the sequence $v'_k = w'_k w_{k-1} \ldots w_{k-K}$ has a number of transitions less than $(K+1)m-2$.

In an even more general manner, when the input words $w_k$ are constituted of m information symbols and in which the state $e_k$ of the transcoder at the instant k depends on the K preceding words $w_{k-1}, \ldots, w_{k-K}$, the transcoder comprises a transcoding table T wherein at least one word $w_k$ leading to a sequence $v_k = w_k w_{k-1} \ldots w_{k-K}$ having a number $\mu_k$ of transitions of information symbols is coded into a word $w'_k$ such that the sequence $v'_k = w'_k w_{k-1} \ldots w_{k-K}$ has a number of transitions of information symbols $\mu'_k < \mu_k$, each transition of information symbol corresponding to a phase transition in the sequence of M-PSK modulation symbols.

Figures 4, 5:
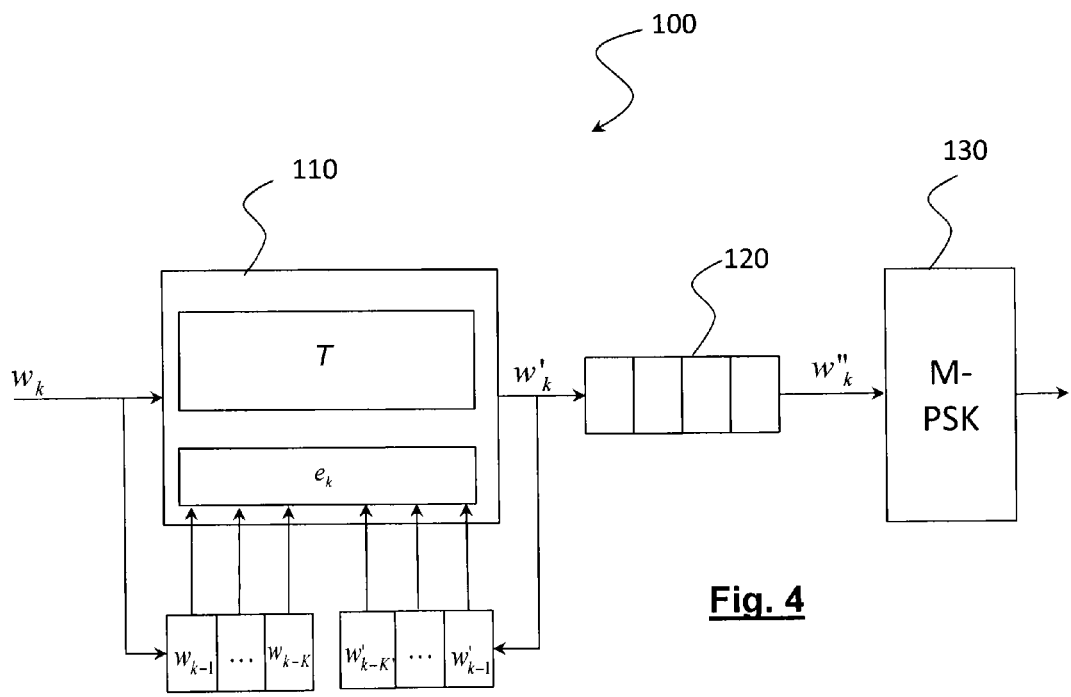
FIG. 4 represents in a schematic manner a digital modulation device according to a second embodiment of the invention.
FIG. 5 represents a sixth example of transcoding table for the digital modulation device of FIG. 4.

FIG. 4 represents in a schematic manner a digital modulation device according to a second embodiment of the invention.

As in the first embodiment, the digital modulation system, 100, comprises a transcoder, 110, transforming the words of m information symbols into words of variable length according to a transcoding table T.

The transcoder functions like a finite state machine, in other words the word of variable length supplied at the output at each coding period k depend on the state of the transcoder and on the word present at its input, as indicated by the expression (7).

However, unlike the first embodiment, the state $e_k$ may depend on the K last preceding words $w_{k-1}, \ldots, w_{k-K}$ and the K' last output words, $w'_{k-1}, \ldots, w'_{k-K'}$ where K' is an integer. It will be understood that the first embodiment may be considered as a particular case of the second with K'=0.

The remainder of the digital modulation device is unchanged, the words of variable length, $w'_k$, are stored one after the other in a FIFO (First In First Out) register, 120, which supplies a word of m information symbols at each modulation period, and each information symbol is then transformed into a M-PSK symbol by the modulator 130.

FIG. 5 represents a sixth example of transcoding table for a particular case of digital modulation device of FIG. 4.

More precisely, it is assumed in this particular case that K=1; K'=1; m=1 and that the information symbols are bits. The state of the transcoder depends on the bit $w_{k-1}$ previously at the input of the transcoder and on the last bit of the word $w'_{k-1}$ previously at the output thereof.

If it is assumed that the transcoding table is given by FIG. 5 and that the sequence of binary symbols at the input is 0, 0, 1, 0, 1, 0, 0, 0, 1, the sequence of binary symbols at the output is then (assuming the initial state arbitrarily set at 1):

| Input sequence | | | | | | | | |
|---|---|---|---|---|---|---|---|---|
| 0 | 0 | 1 | 0 | 1 | 0 | 0 | 0 | 1 |
| Output sequence: | | | | | | | | |
| <u>0</u> | <u>0</u> | 1<u>1</u> | 0<u>0</u> | 1<u>1</u> | 0<u>0</u> | <u>0</u> | <u>0</u> | 1<u>1</u> | where the underlined bits of the output sequence are taken into account for the determination of the state of the transcoder at the following period.

The invention claimed is:

1. A digital modulation method for transforming a sequence of input words ($w_k$), each constituted of m information symbols, into a sequence of M-PSK modulation symbols where $M=2^m$, wherein said method comprises:
   a step of transcoding wherein each input word ($w_k$) is coded into a code word ($w'_k$) of variable length by means of a transcoding table, the transcoding table coding at least one first input word, leading to a first number of phase transitions in said sequence of modulation symbols, into a second word of size greater than m, leading to a second number of phase transitions less than said first number in said sequence;
   a step of concatenation of the code words ($w'_k$) obtained at the preceding step to supply a sequence of output words ($w''_k$), each output word being constituted of m information symbols; and
   a M-PSK modulation supplying for each output word of the sequence a corresponding M-PSK symbol.

2. The digital modulation method according to claim 1, wherein the transcoding table supplies a code word $w'_k$ for each input word $w_k$, the code word $w'_k$ depending on the input word in question as well as the state of the transcoder, the state of the transcoder being determined by the K last input words of the transcoder and the K' last code words supplied by the transcoder, where K and K' are integers greater than or equal to 1.

3. The digital modulation method according to claim 1, wherein the transcoding table supplies a code word $w'_k$ for each input word $w_k$, the code word $w'_k$ depending on the input word in question as well as on the state of the transcoder, the state of the transcoder being determined by the K last input words of the transcoder, where K is an integer greater than or equal to 1.

4. The digital modulation method according to claim 3, wherein the information symbols are each constituted of a bit and that the input words as well as the output words are binary, and that M=2.

5. The digital modulation method according to claim 4, wherein an input binary word $w_k$ leading to in the sequence of modulation symbols $\mu_k=(K+1)m-1$ phase transitions is coded into a word $w'_k$ of size m+1, all of the bits of which have the same value.

6. The digital modulation method according to claim 4, wherein K=1 and m=1, the transcoding table being given by:

| $w_{k-1}$ | $w_k$ | $w'_k$ |
|---|---|---|
| 0 | 0 | 0 |
| 1 | 0 | 11 |
| 0 | 1 | 00 |
| 1 | 1 | 1 |

7. The digital modulation method according to claim 4, wherein K=1 and m=1, the transcoding table being given by:

| $w_{k-1}$ | $w_k$ | $w'_k$ |
|---|---|---|
| 0 | 0 | 0 |
| 1 | 0 | 0 |
| 0 | 1 | 11 |
| 1 | 1 | 1 |

8. The digital modulation method according to claim 4, wherein K=1 and m=1, the transcoding table being given by:

| $w_{k-1}$ | $w_k$ | $w'_k$ |
|---|---|---|
| 0 | 0 | 0 |
| 1 | 0 | 00 |
| 0 | 1 | 1 |
| 1 | 1 | 1 |

9. The digital modulation method according to claim 4, wherein the step of 2-PSK modulation transforms a bit from a first value into $$e^{-j\frac{\Phi}{2}}$$

and a bit of a second value, opposite to the first value, into $$e^{+j\frac{\Phi}{2}}$$

where $\Phi$ is an angle less than $\pi/2$.

10. A digital modulator for transforming a sequence of input words ($w_k$), each constituted of m information symbols, into a sequence of M-PSK modulation symbols where $M=2^m$, wherein said digital modulator comprises:
 a transcoder wherein each input word is coded into a code word of variable length using a transcoding table stored within the transcoder, the transcoding table coding at least one first word, leading to a first number of phase transitions in said sequence of modulation symbols, into a second word of size greater than m leading to a second number of phase transitions less than said first number in said sequence;
 a FIFO register adapted to concatenate code words obtained at the preceding step to supply a sequence of output words ($w''_k$), each output word being constituted of m information symbols; and
 a M-PSK modulator supplying for each output word a corresponding M-PSK symbol.

11. The digital modulator according to claim 10, wherein the transcoding table supplies a code word $w'_k$ for each input word $w_k$, the code word $w'_k$ depending on the binary word in question as well as on the state of the transcoder, the state of the transcoder being determined by the K last input words of the transcoder and the K' last code words supplied by the transcoder, where K and K' are whole numbers greater than or equal to 1.

12. The digital modulator according to claim 10, wherein the transcoding table supplies a code word $w'_k$ for each input word $w_k$, the code word $w'_k$ depending on the binary word in question as well as on the state of the transcoder, the state of the transcoder being determined by the K last binary words at the input of the transcoder, where K is a whole number greater than or equal to 1.

* * * * *